United States Patent
Cho et al.

(10) Patent No.: US 9,147,020 B2
(45) Date of Patent: Sep. 29, 2015

(54) TRANSMISSION LINE CHARACTERIZATION USING EM CALIBRATION

(75) Inventors: Hsiu-Ying Cho, Hsin-Chu (TW); Jiun-Kai Huang, Hsin-Chu (TW); Wen-Sheh Huang, Hsin-Chu (TW); Chin-Wei Kuo, Zhubei (TW); Min-Chie Jeng, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 575 days.

(21) Appl. No.: 13/091,803

(22) Filed: Apr. 21, 2011

(65) Prior Publication Data
US 2012/0267626 A1    Oct. 25, 2012

(51) Int. Cl.
H01L 23/522 (2006.01)
G06F 17/50 (2006.01)
H01L 21/66 (2006.01)

(52) U.S. Cl.
CPC ............ *G06F 17/5036* (2013.01); *H01L 22/34* (2013.01)

(58) Field of Classification Search
USPC ............... 333/25, 33, 113, 161, 204, 208
See application file for complete search history.

(56) References Cited

U.S. PATENT DOCUMENTS 4,418,324 A * 11/1983 Higgins .................. 333/204

OTHER PUBLICATIONS

Cho, H-Y, et al., "A Novel Transmission-Line Deembedding Technique for RF Device Characterization," IEEE Transactions on Electron Devices, vol. 56, No. 12, Dec. 2009, pp. 3160-3167.

Cho, M-H, et al., "A Shield-Based Three-Port De-Embedding Method for Microwave On-Wafer Characterization Of Deep-Submicrometer Silicon MOSFETs," IEEE Transactions on Microwave Theory and Techniques, vol. 53, No. 9, Sep. 2005, pp. 2926-2934.

Gonzalez, G., "Microwave Transistor Amplifier Analysis and Design," Representations of Two-Port Networks, Ch. 1, pp. 2-4.

Kolding, T., "A Four-Step Method for De-Embedding Gigahertz On-Wafer CMOS Measurements," IEEE Transactions on Electronic Devices, vol. 47, No. 4, Apr. 2000, pp. 734-740.

Liang, Q., et al., "A Simple Four-Port Parasitic Deembedding Methodology for High-Frequency Scattering Parameter and Noise Characterization of SiGe HBTs," IEEE Transactions on Microwave Theory and Techniques, vol. 51, No. 11, Nov. 2003, pp. 2165-2174.

Song, J., et al., "A De-embedding Technique for Interconnects," IEEE, 2001, pp. 129-132.

Tiemeijer, L., et al., "Comparison of the "Pad-Open-Short" and "Open-Short-Load" Deembedding Techniques for Accurate On-Wafer RF Characterization of High-Quality Passives," IEEE Transactions on Microwave Theory and Techniques, vol. 53, No. 2, Feb. 2005, pp. 723-729.

Vandamme, E.P., et al., "Improved Three-Step De-Embedding Method to Accurately Account for the Influence of Pad Parasitics in Silicon On-Wafer RF Test-Structures," IEEE Transactions on Electron Devices, vol. 48, No. 4, Apr. 2001, pp. 737, 742.

* cited by examiner

*Primary Examiner* — Thomas L Dickey
(74) *Attorney, Agent, or Firm* — Slater & Matsil, L.L.P.

(57) ABSTRACT

A method includes simulating characteristics of a first transmission line having a first length, and simulating characteristics of a second transmission line having a second length greater than the first length. A calculation is then performed on the characteristics of the first transmission line and the characteristics of the second transmission line to generate intrinsic characteristics of a third transmission line having a length equal to a difference of the second length and the first length.

20 Claims, 4 Drawing Sheets

TRANSMISSION LINE CHARACTERIZATION USING EM CALIBRATION

BACKGROUND

Integrated circuits (ICs) formed on semiconductor substrates include multiple active and passive components. Although it is desirable to verify that each component in the ICs complies with its specific design specification, typically, after integrated into a circuit, the components can no longer be readily tested. Therefore, "stand-alone" copies of the individual IC components, which are the components fabricated with the same process and with the same physical/electrical characteristics as the IC components, are fabricated on the wafer. It is assumed that the physical/electrical properties measured for the "stand-alone" copies represent those of the non-tested IC components in the ICs.

During testing, a "stand-alone" copy, which is commonly referred to as "device-under-test" (DUT), is electrically connected to test pads and pad leads, which are further connected to an external test equipment. Although the measured physical/electrical properties should accurately represent those of the DUT, the test pads and pad leads have their own physical/electrical characteristics that contribute to the measured characteristics of the DUT. The contributions from the test pads and test leads are known as "parasitics", which include, for example, parasitic resistance, parasitic capacitance, and parasitic inductance, etc. The parasitics are factored out or extracted by a process known as "de-embedding" to obtain the intrinsic characteristics of the DUT.

In the simulations of the IC devices, however, some of the parasitics are difficult to be factored out. For example, in the simulation of transmission lines, the simulated ports for receiving input signals and extracting output signals are set on transmission lines. Setting ports on transmission lines also introduces parasitics. There were no effective methods for removing the parasitics from the simulated characteristics of the transmission lines. On the other hand, with the sizes of the integrated circuit devices became increasingly smaller, and the operation frequency of the integrated circuit devices became increasingly higher, the parasitics became increasingly more severe.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel de-embedding method for de-embedding parasitics of integrated circuit devices is provided in accordance with an embodiment. The variations of the embodiment are then discussed. Throughout the various views and illustrative embodiments, like reference numbers are used to designate like elements.

Figure 1:
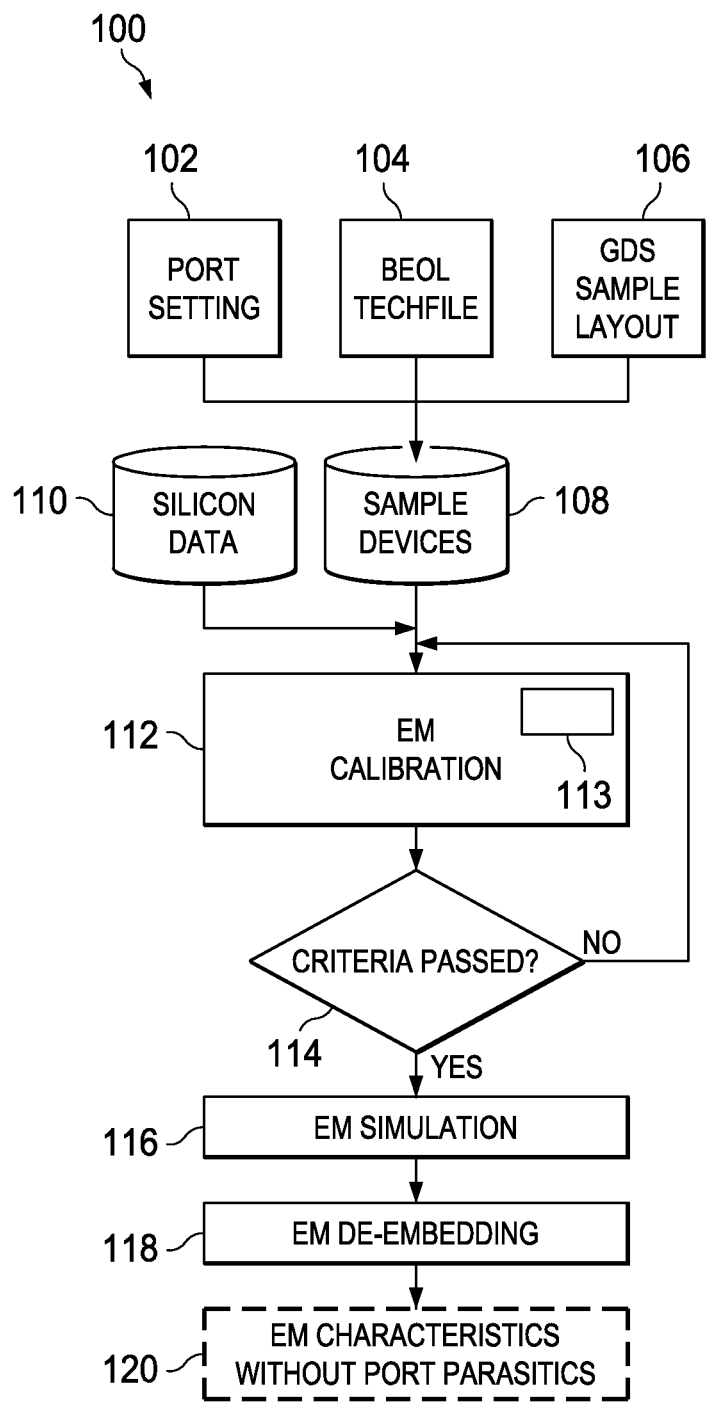
FIG. 1 illustrates a schematic flow chart for retrieving intrinsic electric-magnetic (EM) characteristics of an integrated circuit device through de-embedding in accordance with various embodiments.

FIG. 1 illustrates a schematic flow 100 for retrieving intrinsic electric-magnetic (EM) characteristics of an integrated circuit device. The EM characteristics of the integrated circuit device include, but are not limited to, the impedance, the inductance, the resistance, the frequency response, and the like. Throughout the description, the term "intrinsic characteristics" refers to the EM characteristics of the integrated circuit device in which parasitics generated in the measurement and/or simulation of the integrated circuit device have been eliminated, wherein the parasitics may be generated from test pads, pad leads, and the ports for inputting and outputting signal to the integrated circuit device. The integrated circuit device may include transmission lines such as coplanar lines, micro-strips, coplanar waveguides, and the like, and may also include other devices other than transmission lines.

Blocks 102, 104, and 106 represent the steps of defining sample integrated circuit devices, where the sample integrated circuit devices are represented, modeled, and stored as block 108. The sample integrated circuit devices (such as devices 20 and 40 in FIGS. 2 and 3) will be simulated and de-embedded in subsequent steps. As shown as block 102, simulated ports are set on the integrated circuit devices, so that simulated signals (such as voltages, currents, RF signals, etc) may be applied on the simulated input ports, and the simulated output signals may be retrieved from the output ports. The backend of line (BEOL) properties of the wafer/chip, in which the integrated circuit devices extend into, may also be defined, for example, as techfiles, as shown as block 104. The BEOL properties affect the characteristics of the sample integrated circuit devices. For example, the thickness of a metal layer may affect the thickness of the sample transmission lines that are formed in the metal layer. The layouts of the sample integrated circuits are also defined (block 106), for example, as graphic database system (GDS) files.

In step 112, an EM calibration is performed. First, an initial EM model 113 is provided, and is used to simulate the EM characteristics of the sample integrated circuit devices. To verify whether EM model 113 accurately reflects real devices on chips, sample integrated circuit devices (which may be similar to, for example, device 20 in FIG. 2 and device 40 in FIG. 3) that are identical to the simulated sample integrated circuit devices are also formed on physical chips (wafers) as stand-alone devices, and the EM characteristics of the sample integrated circuit devices are measured from the physical chips. The EM characteristics measured from the physical chips are referred to as silicon data (block 110). The simulated characteristics of the sample integrated circuit devices are compared to the measured characteristics (silicon data 110) to determine whether EM model 113 is accurate enough, and to determine whether the simulated samples accurately reflect the sample integrated circuit devices formed on silicon chips. As shown in step 114, criteria are pre-determined in order to determine whether the differences between the simulated characteristics and the measured characteristics (from physical chips) are close enough. If the differences are smaller than the criteria, the EM calibration passes. Otherwise, if the differences are greater than the pre-defined criteria, the flow proceeds to step 112 again, and EM model 113 is adjusted, and a further calibration step is performed. The loop comprising steps 112 and 114 is repeated until the criteria passes.

Figure 2:
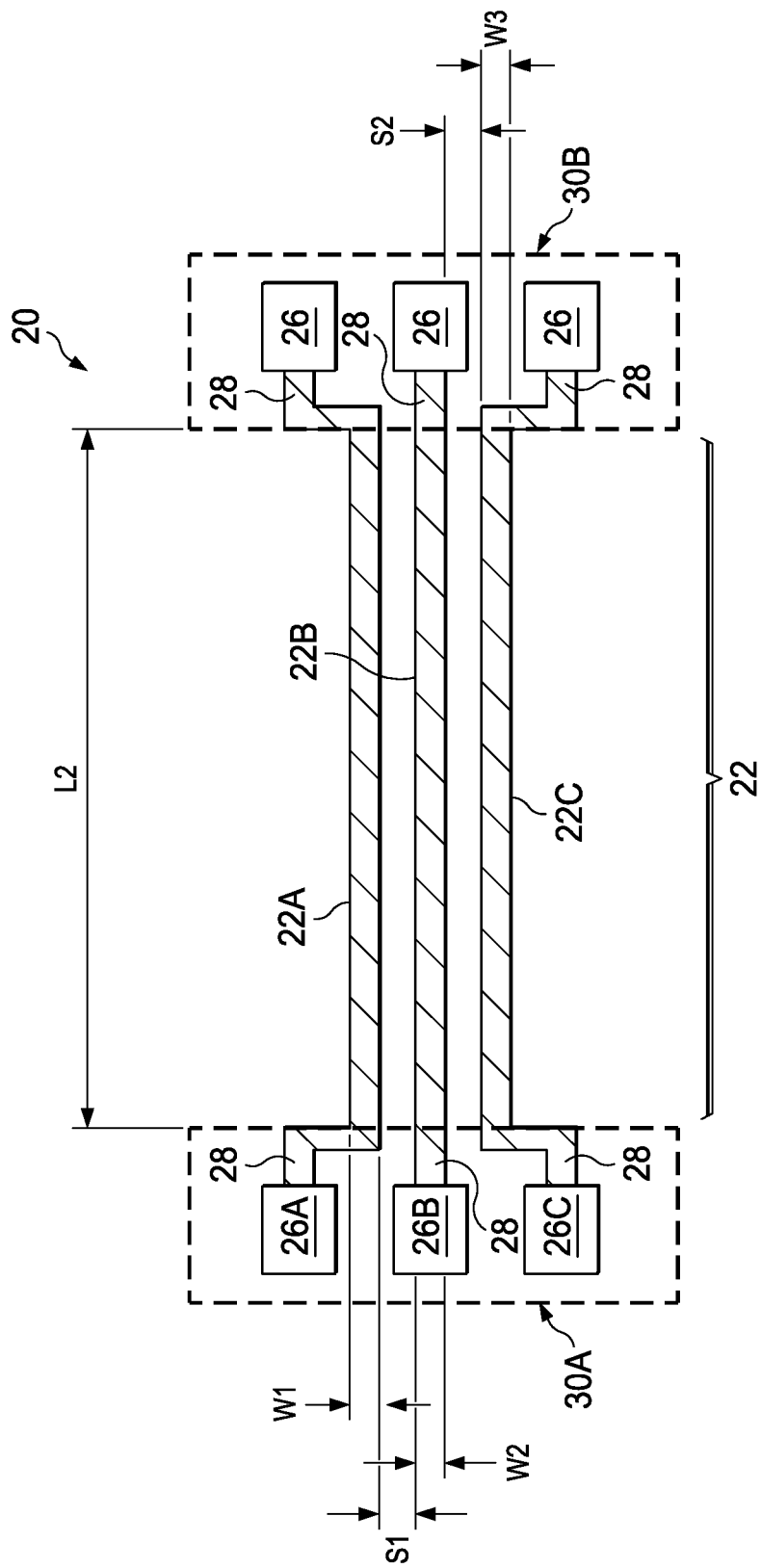
FIGS. 2 and 3 are top views of exemplary devices for retrieving intrinsic EM characteristics of a transmission line.
Figure 3:
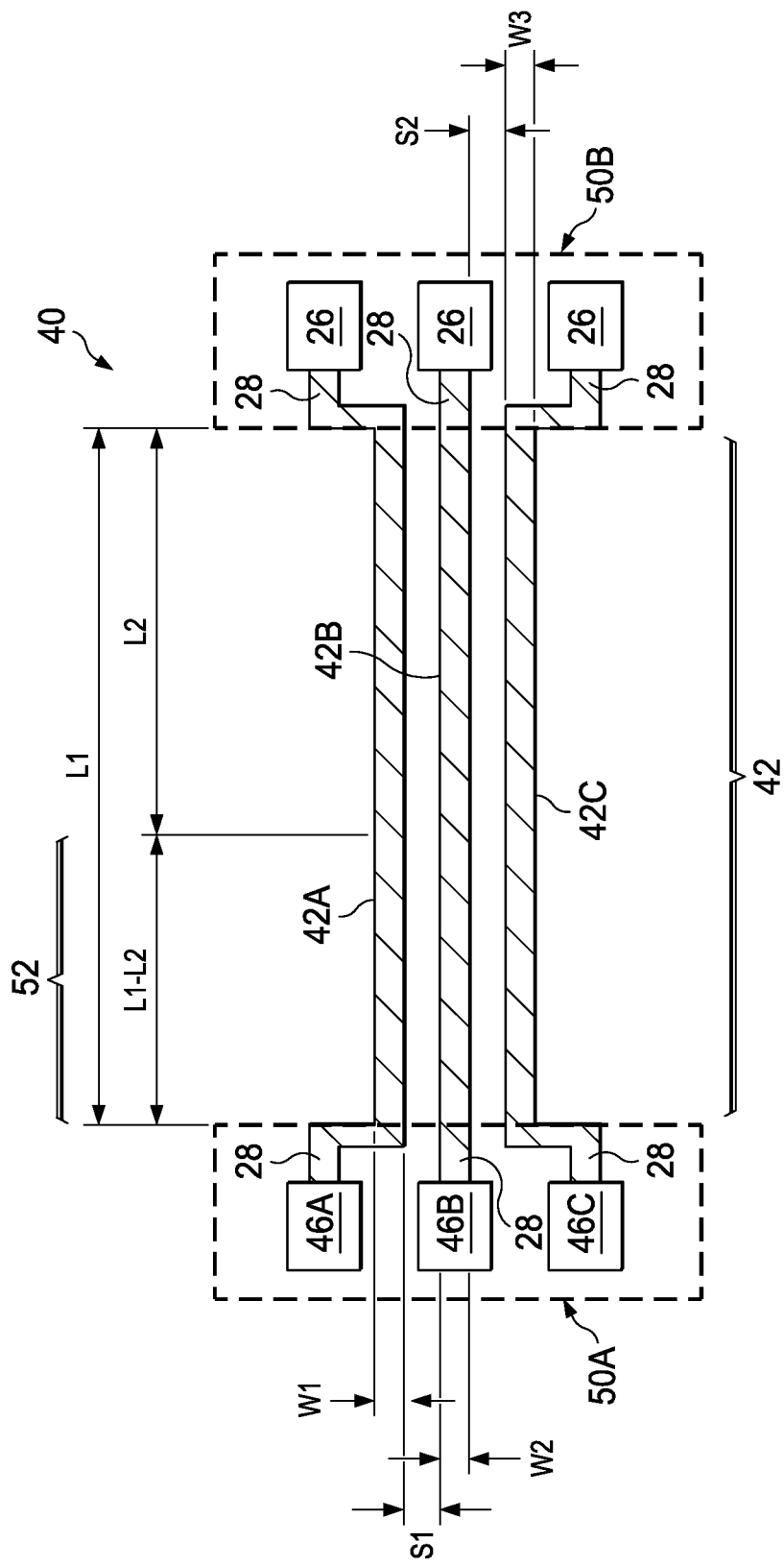

In step 116, the calibrated EM model 113 is used to simulate the characteristics of two sample devices. The sample devices have structures similar to or identical as the structures reflected by EM model 113. For example, assuming in step 112, an EM model of transmission line is constructed, the sample devices will also be transmission lines having similar line widths, thickness, line spacings, etc, as the model. FIGS. 2 and 3 illustrate two sample devices that are the same as each other except the transmission line in the sample device shown in FIG. 3 is longer than the transmission line in the sample device shown in FIG. 2. Referring to FIG. 2, sample device 20 includes transmission line 22, which is formed of ground lines 22A and 22C, and signal line 22B between ground lines 22A and 22C. Lines 22A, 22B, and 22C are parallel to each other. Test pads 26 are formed at an end of transmission line 22, wherein test pads 26 include ground (G) pads 26A and 26C that are connected to ground lines 22A and 22C, and signal pad (S) that is connected to signal line 22B. Pad leads 28 may be formed as the connection between test pads 26 and transmission line 22. Throughout the description, test pads 26 and pad leads 28 in combination are referred to as terminal structure 30A of test device 20. On the other end of transmission line 22, there may reside another terminal structure 30B, which may have a structure identical to, or different from, the structure of terminal structure 30A. Test pads 26A, 26B, and 26C in combination are also referred to as GSG pads. In alternative embodiments, the terminal structures may include GS pads, GSGSG pads, or the like.

Figure 4:
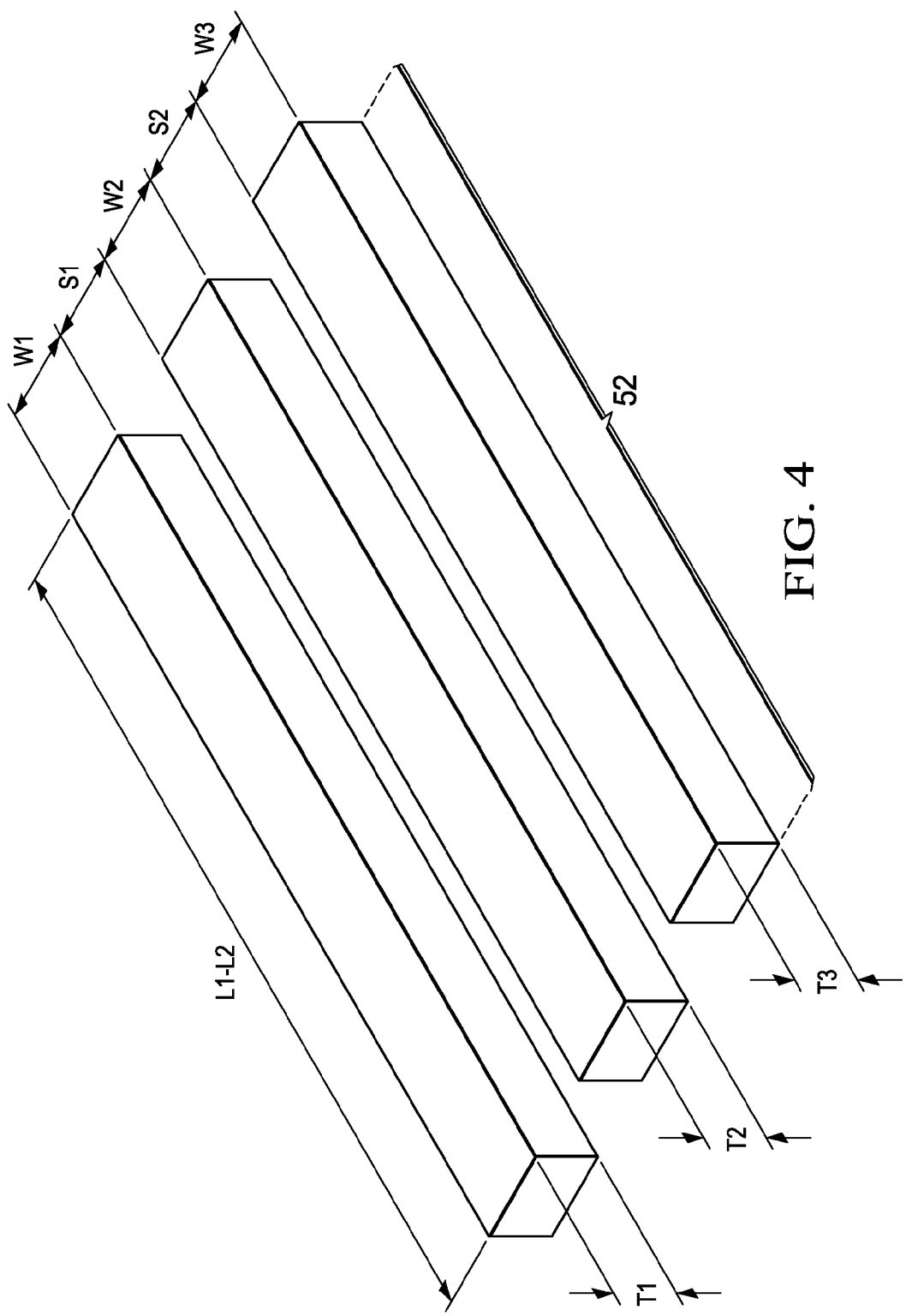
FIG. 4 illustrates a perspective view of a transmission line, from which the intrinsic EM characteristics is retrieved.

Referring to FIG. 3, sample device 40 includes transmission line 42, which is formed of ground lines 42A and 42C, and signal line 42B between ground lines 42A and 42C. The structure of transmission line 42 is essentially the same as transmission line 22, except length L1 of transmission line 42 is greater than length L2 of transmission line 22. Alternatively stating, lines 42A, 42B, and 42C have same dimensions (such as widths W1, W2, W3, spacings such as S1 and S2, and thicknesses T1, T2, and T3 (not shown in FIGS. 2 and 3, please refer to FIG. 4)) as the respective ones of lines 22A, 22B, and 22C. Accordingly, when formed on physical chips for measuring silicon data 110 (FIG. 1), transmission lines 42 and 22 may be formed in the same metal layer or extending into the same metal layers. In addition, devices 20 and 40 may be formed on physical chips/wafers as stand-alone devices that are not electrically connected to other integrated circuit devices and/or conductive features, and the characteristics of devices 20 and 40 may be measured as silicon data, as shown in block 110.

Terminal structures 50A and 50B are formed on the two ends of the transmission line 42, and have identical structures as terminal structures 30A and 30B, respectively. The respective test pads 56A, 56B, and 56C, and pad leads 58 are also illustrated. Throughout the description, device 40 is referred to as a long device, and the respective transmission line 42 is referred to as a long transmission line, while device 20 is referred to as a short device, and the respective transmission line 22 is referred to as a short transmission line.

In step 116 of FIG. 1, the EM characteristics of devices 20 and 40 are simulated. When performing the simulation, the input signals (such as voltages, currents, waveforms with various patterns and frequencies, and the like) may be simulated as inputting into test pads 26 of terminal structures 30A/50A. Similarly, the output signals may be simulated as being retrieved from test pads 26 of terminal structures 30B/50B. This means that the ports are not set to the ends of transmission lines 22 and 42, and simulated signals are not input to, and retrieve from, the ends of transmission lines 22 and 42. Such a way of simulating inputting and outputting signals is also referred to as setting input ports on test pads 26 of terminal structures 30A/50A and setting output ports on test pads 26 of terminal structures 30B/50B. When performing the simulation, same input signals (such as voltages, currents, waveforms, and the like) are applied on the test pads 26 of both devices 20 and 40, and the respective output signals retrieved from transmission lines 22 and 42, which may be different from each other, are retrieved from the respective output test pads 26 in the simulation.

Next, as shown as step 118 in FIG. 1, an EM de-embedding is performed by performing a calculation on the simulated characteristics of device 20 and the simulated characteristics of device 40. A schematic calculation step is illustrated in Equations 1 through 5. In Equations 1 through 5, the letter "A" represents the A matrices of the transmission matrices, also known as ABCD matrices. The letter "Y" represents the admittance matrices. The values in the A matrices may be retrieved from EM model 113 (FIG. 1), and/or from the simulated characteristics obtained through simulation step 116 in FIG. 1. The symbols "L1" "L2" represent transmission lines 42 and 22 (which have length L1 and L2, respectively), respectively, and the symbol "L1-L2" represents the difference between transmission lines 42 and 22. Symbol P1 represents the ports that are set on terminal structures 30A and 50A, while symbol P2 represents the ports that are set on terminal structures 30B and 50B.

$$[A_{L1}] = [A_{P1}][A_{L1}][A_{P2}] \quad \text{[Eq. 1]}$$

$$[A_{L2}] = [A_{P1}][A_{L2}][A_{P2}] \quad \text{[Eq. 2]}$$

$$[A^T_{L1-L2}] = [A_{L1}][A_{L2}]^{-1} \quad \text{[Eq. 3]}$$
$$= [A_{P1}][A_{L1}][A_{P2}][A_{P2}]^{-1}[A_{L2}]^{-1}[A_{P1}]^{-1}$$
$$= [A_{P1}][A_{L1-L2}][A_{P1}]^{-1}$$

$$[Y^T_{L1-L2}] = [Y_{L1-L2}] + \begin{bmatrix} Y_L & 0 \\ 0 & -Y_L \end{bmatrix} \quad \text{[Eq. 4]}$$

$$[Y_{L1-L2}] = ([Y^T_{L1-L2}] + \text{swap}[Y^T_{L1-L2}])/2 \quad \text{[Eq. 5]}$$

Equations 1 through 5 indicate that through the calculation of the simulated characteristics of transmission lines 22 and 42, the effects of the common parts that exist in both devices 20 and 40, which common parts (such as $A_{P1}$, $A_{P2}$, $A_{L2}$, etc.) include terminal structures 30A/30B, 50A/50B, and the port parasitics, are canceled (Equation 5) since these factors are identical in devices 20 and 40. On the other hand, the length L1 of transmission line 42 is greater than length L2 of transmission line 22. Accordingly, the intrinsic characteristics of an (intrinsic) transmission line (schematically illustrated as portion 52 in FIGS. 3 and 4) are obtained. Transmission line 52 is essentially the same as transmission lines 22 and 42 except the length of transmission line 52 is equal to L1-L2. In the exemplary calculation as shown in Equation 5, the admittance matrix $Y_{L1-L2}$, which is the intrinsic admittance matrix of transmission line 52 is obtained. The intrinsic admittance matrix of transmission line 52 does not include the port parasitics, the test pad parasitics, and the pad lead parasitics.

Referring back to step 118 in FIG. 1, due to the de-embedding, the intrinsic characteristics of a transmission line (shown as portion 52 in FIGS. 3 and 4) with the port parastics removed is obtained, as shown in block 120.

In the above-described embodiments, the de-embedding of port parasitics is explained using a long/short scheme, in which a long transmission line (which is a device-under-test (DUT)) and a short transmission line are involved. In alternative embodiments, the teaching may be applied on other de-embedding methods such as open de-embedding methods, open-short de-embedding methods, short-open de-embedding methods, three-step de-embedding methods (including the de-embedding using a short device, an open device, and a through device) may be used in steps 116 and 118 in FIG. 1. For example, in the open-short de-embedding methods, transmission matrices of a DUT structure including test pads and pad leads, an open structure (including test pads and pad leads, but not the DUT), and a short structure (also including test pads and pad leads, but not the DUT) are simulated, wherein in the simulation, input and output ports are also set on the test pads of the DUT structure, the open structure, and the short structure. The DUT structure, the open structure, and the short structure may have identical terminal structures including pads, pad leads, and/or the like. Accordingly, through the calculation of the simulated matrices as in Equations 1 through 5, the parasitics of terminal structures and the ports are cancelled, and the intrinsic characteristics of the DUT may be obtained.

Experiment results have shown that by using the de-embedding methods as described in the embodiments, the simulated characteristics of the transmission lines are very close to the silicon data. As a comparison, if the de-embedding is not performed, the simulated characteristics of the transmission lines may deviate significantly from the silicon data. For example, before the de-embedding, a simulated inductance of a transmission line may be about 180 (which is a normalized value) at an operation frequency of 20 GHz. The value 180 is significantly different from the inductance value of 120 (a normalized value from silicon data) at the same operation frequency. With the de-embedding performed, however, the simulated inductance is about 118 (normalized value) at the same operation frequency of 20 GHz. Such value is very close to the silicon data of 120.

In accordance with embodiments, a method includes simulating characteristics of a first transmission line having a first length, and simulating characteristics of a second transmission line having a second length greater than the first length. A calculation is then performed on the characteristics of the first transmission line and the characteristics of the second transmission line to generate intrinsic characteristics of a third transmission line having a length equal to a difference of the second length and the first length.

In accordance with other embodiments, a method includes simulating characteristics of a first integrated circuit device by simulating applying an input signal to first test pads connected to the first integrated circuit device, and simulating characteristics of a second integrated circuit device by simulating applying the input signal to second test pads connected to the second integrated circuit device. The method further includes performing a de-embedding to the characteristics of the first and the second integrated circuit devices to generate intrinsic characteristics, wherein the intrinsic characteristics are without effects of the first and the second test pads.

In accordance with yet other embodiments, a test structure includes a first and a second integrated circuit device formed as stand-alone devices in a same chip. The first integrated circuit device includes a first transmission line including a first ground line and a first signal line parallel to the first ground line; a first terminal structure including a first ground pad electrically connected to the first ground line and a first signal pad electrically connected to the first signal line; and a second terminal structure including a second ground pad electrically connected to the first ground line and a second signal pad electrically connected to the first signal line. The first and the second terminal structures are connected to opposite ends of the first transmission line. The second integrated circuit device includes a second transmission line including a second ground line and a second signal line parallel to the second ground line, wherein the second transmission line has a length greater than a length of the first transmission line; a third terminal structure including a third ground pad electrically connected to the second ground line and a third signal pad electrically connected to the second signal line, wherein the first and the third terminal structures are identical; and a fourth terminal structure including a fourth ground pad electrically connected to the second ground line and a fourth signal pad electrically connected to the second signal line. The third and the fourth terminal structures are connected to opposite ends of the first transmission line, and wherein the second and the fourth terminal structures are identical.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A test structure comprising:
   a first integrated circuit device comprising:
      a first transmission line comprising a first ground line and a first signal line parallel to the first ground line;
      a first terminal structure comprising a first ground pad electrically connected to the first ground line and a first signal pad electrically connected to the first signal line; and
      a second terminal structure comprising a second ground pad electrically connected to the first ground line and a second signal pad electrically connected to the first signal line, wherein the first and the second terminal structures are connected to opposite ends of the first transmission line; and
   a second integrated circuit device in a same chip as the first integrated circuit device, wherein each of the first and the second integrated circuit devices is a stand-alone device, and wherein the second integrated circuit device comprises:
      a second transmission line comprising a second ground line and a second signal line parallel to the second ground line, wherein the second transmission line has a length greater than a length of the first transmission line;
      a third terminal structure comprising a third ground pad electrically connected to the second ground line and a third signal pad electrically connected to the second signal line, wherein the first and the third terminal structures are identical; and a fourth terminal structure comprising a fourth ground pad electrically connected to the second ground line and a fourth signal pad electrically connected to the second signal line, wherein the third and the fourth terminal structures are connected to opposite ends of the first transmission line, wherein the second and the fourth terminal structures are identical, and wherein each of the first and the second transmission lines further comprises an additional ground line and test pads connected to opposite ends of the additional ground line, wherein the ground line and the additional ground line are on opposite sides of the respective signal line that is in the same one of the first and the second transmission lines.

2. The test structure of claim 1, wherein the first and the second transmission lines have an essentially identical structure except the lengths of the first and the second transmission lines are different from each other, and wherein the first and the second transmission lines have a same thickness, a same line spacing, and same line widths.

3. The test structure of claim 1, wherein a width of the first ground pad is larger than a width of the first ground line.

4. The test structure of claim 1, wherein a width of the first signal pad is larger than a width of the first signal line.

5. The test structure of claim 1, wherein a width of the third ground pad is larger than a width of the second ground line.

6. The test structure of claim 1, wherein a width of the third signal pad is larger than a width of the second signal line.

7. The test structure of claim 1, wherein the first ground line comprises a first portion and a second portion, the first portion of the first ground line being parallel to the first signal line and the second portion of the first ground line being perpendicular to the first signal line.

8. The test structure of claim 1, wherein the second ground line comprises a first portion and a second portion, the first portion of the second ground line being parallel to the second signal line and the second portion of the second ground line being perpendicular to the second signal line.

9. A test structure comprising:
a first integrated circuit device comprising:
a first transmission line comprising a first ground line and a first signal line parallel to the first ground line, wherein at least a portion of the first ground line is perpendicular to the first signal line;
a first terminal structure comprising a first ground pad electrically connected to the first ground line and a first signal pad electrically connected to the first signal line; and
a second terminal structure comprising a second ground pad electrically connected to the first ground line and a second signal pad electrically connected to the first signal line, wherein the first and the second terminal structures are connected to opposite ends of the first transmission line; and
a second integrated circuit device in a same chip as the first integrated circuit device, wherein each of the first and the second integrated circuit devices is a stand-alone device, and wherein the second integrated circuit device comprises:
a second transmission line comprising a second ground line and a second signal line parallel to the second ground line, wherein at least a portion of the second ground line is perpendicular to the second signal line, and wherein the second transmission line has a length greater than a length of the first transmission line;
a third terminal structure comprising a third ground pad electrically connected to the second ground line and a third signal pad electrically connected to the second signal line, wherein the first and the third terminal structures are identical; and
a fourth terminal structure comprising a fourth ground pad electrically connected to the second ground line and a fourth signal pad electrically connected to the second signal line, wherein the third and the fourth terminal structures are connected to opposite ends of the first transmission line, wherein the second and the fourth terminal structures are identical, and wherein each of the first and the second transmission lines further comprises an additional ground line and test pads connected to opposite ends of the additional ground line, wherein the ground line and the additional ground line are on opposite sides of the respective signal line that is in the same one of the first and the second transmission lines.

10. The test structure of claim 9, wherein a width of the first ground pad is larger than a width of the first ground line.

11. The test structure of claim 9, wherein a width of the first signal pad is larger than a width of the first signal line.

12. The test structure of claim 9, wherein a width of the third ground pad is larger than a width of the second ground line.

13. The test structure of claim 9, wherein a width of the third signal pad is larger than a width of the second signal line.

14. A method comprising:
forming a first integrated circuit device, wherein forming the first integrated circuit device comprises:
forming a first transmission line comprising a first ground line and a first signal line parallel to the first ground line;
forming a first terminal structure comprising a first ground pad electrically connected to the first ground line and a first signal pad electrically connected to the first signal line; and
forming a second terminal structure comprising a second ground pad electrically connected to the first ground line and a second signal pad electrically connected to the first signal line, wherein the first and the second terminal structures are connected to opposite ends of the first transmission line; and
forming a second integrated circuit device in a same chip as the first integrated circuit device, wherein each of the first and the second integrated circuit devices is a stand-alone device, and wherein forming the second integrated circuit device comprises:
forming a second transmission line comprising a second ground line and a second signal line parallel to the second ground line, wherein the second transmission line has a length greater than a length of the first transmission line;
forming a third terminal structure comprising a third ground pad electrically connected to the second ground line and a third signal pad electrically connected to the second signal line, wherein the first and the third terminal structures are identical; and
forming a fourth terminal structure comprising a fourth ground pad electrically connected to the second ground line and a fourth signal pad electrically connected to the second signal line, wherein the third and the fourth terminal structures are connected to opposite ends of the first transmission line, wherein the second and the fourth terminal structures are identical, and wherein forming each of the first and the second transmission lines further comprises forming an additional ground line and test pads connected to opposite ends of the additional ground line, wherein the ground line and the additional ground line are on opposite sides of the respective signal line that is in the same one of the first and the second transmission lines.

15. The method of claim 14, wherein the first and the second transmission lines have an essentially identical structure except the lengths of the first and the second transmission lines are different from each other, and wherein the first and the second transmission lines have a same thickness, a same line spacing, and same line widths.

16. The method of claim 14, further comprising measuring first characteristics of the first integrated circuit device and second characteristics of the second integrated circuit device.

17. The method of claim 16, wherein the first characteristics comprise parasitic contributions from the first terminal structure and the second terminal structure.

18. The method of claim 16, wherein the second characteristics comprise parasitic contributions from the third terminal structure and the fourth terminal structure.

19. The method of claim 14, wherein a width of the first ground pad is larger than a width of the first ground line.

20. The method of claim 14, wherein the first ground line comprises a first portion and a second portion, the first portion of the first ground line being parallel to the first signal line and the second portion of the first ground line being perpendicular to the first signal line.

\* \* \* \* \*